United States Patent
Lenchenkov (10) Patent No.: US 12,342,650 B2
(45) Date of Patent: Jun. 24, 2025

(54) NEAR INFRARED TO FAR INFRARED POLARIZATION SENSITIVE IMAGE SENSOR

(71) Applicant: OmniVision Technologies, Inc., Santa Clara, CA (US)

(72) Inventor: Victor Lenchenkov, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 548 days.

(21) Appl. No.: 17/712,453

(22) Filed: Apr. 4, 2022

(65) Prior Publication Data
US 2023/0317754 A1    Oct. 5, 2023

(51) Int. Cl.
*H10F 39/00* (2025.01)
*H10F 39/18* (2025.01)

(52) U.S. Cl.
CPC ....... *H10F 39/8063* (2025.01); *H10F 39/184* (2025.01)

(58) Field of Classification Search
CPC ......... H01L 27/14627; H01L 27/14649; H01L 27/14669
See application file for complete search history.

(56) References Cited

U.S. PATENT DOCUMENTS

| | | | |
|---|---|---|---|
| 2020/0098819 A1* | 3/2020 | Lenchenkov | H01L 27/14623 |
| 2021/0270676 A1 | 9/2021 | Boudou et al. | |
| 2021/0313516 A1 | 10/2021 | Okabe | |
| 2021/0333151 A1 | 10/2021 | Miyata et al. | |
| 2021/0342578 A1 | 11/2021 | Pezzaniti et al. | |
| 2022/0239840 A1* | 7/2022 | Lenchenkov | H04N 25/11 |

OTHER PUBLICATIONS

Wilson et al., Evidence of Longitudinal Acoustic Phonon Generation in Si Doping Superlattices by Ge Prism-Coupled THz Laser Radiation, IOP Conf. Series: Materials Science and Engineering 68, 2014, 5 pages.
Takemoto et al., "Multi-storied photodiode CMOS image sensor with wire grid polarizer to detect polarization information", ITE Technical Report, vol. 42, No. 40, Nov. 2018, 2 pages.
Miragliotta et al., "Infrared Polarization-Sensitive Imaging with Meta-Technology", Johns Hopkins APL Technical Digest, vol. 35, No. 4, 2021, 5 pages.

* cited by examiner

*Primary Examiner* — Kevin K Pyo
(74) *Attorney, Agent, or Firm* — COZEN O'CONNOR (57) ABSTRACT

A polarization-sensitive infrared sensitive image sensor, including a plurality of pixels in a semiconductor substrate and forming a pixel array, each pixel including: at least one microlens; at least one photodiode; and at least one light absorbing patch above a corresponding photodiode, each light absorbing patch oriented at a predetermined angle with respect to each of the at least one light absorbing patch, the light absorbing patch absorbs a portion of incident light dependent on polarization of the incoming light relative to the predetermined angle of the light absorbing patch.

4 Claims, 7 Drawing Sheets

| Quadrant | Heat Map 300 | Heat Map 400 | Heat Map 500 | Heat Map 600 |
|---|---|---|---|---|
| 182 | 0.0108 | 0.0061 | 0.0013 | 0.0061 |
| 184 | 0.0013 | 0.0061 | 0.0107 | 0.0061 |
| 186 | 0.0071 | 0.0018 | 0.0052 | 0.0104 |
| 188 | 0.0053 | 0.0104 | 0.0071 | 0.0018 |

NEAR INFRARED TO FAR INFRARED POLARIZATION SENSITIVE IMAGE SENSOR

BACKGROUND

Camera modules in commercial products such as stand-alone digital cameras, mobile devices, automotive components, and medical devices include an image sensor having a microlens. The microlens includes a plurality of photodiodes arranged as a two-dimensional periodic array. Many image sensors include a microlens array, formed of a plurality of microlenses each aligned to a respective pixel. The periodicity of the image sensor's pixel array and microlens array thereon result in the image sensor resembling a reflective two-dimensional diffraction grating. Part of light incident on the image sensor is reflected toward the camera's imaging lens.

SUMMARY OF THE EMBODIMENTS

Embodiments disclosed herein extend sensitivity to infrared and polarization in CMOS image sensors by using local heating from infrared in a thin conductor.

According to an embodiment, a polarization-sensitive infrared sensitive image sensor, including a plurality of pixels in a semiconductor substrate and forming a pixel array, each pixel including: at least one microlens; at least one photodiode; and at least one light absorbing patch above a corresponding photodiode, each light absorbing patch oriented at a predetermined angle with respect to each of the at least one light absorbing patch, the light absorbing patch absorbs a portion of incident light dependent on polarization of the incoming light relative to the predetermined angle of the light absorbing patch.

According to an embodiment, A method for detecting incident infrared light using at least one light absorbing patch, including absorbing a portion of an incident light by at least one light absorbing patch, the portion being a polarization component that is parallel to the at least one light absorbing patch; heating the at least one light absorbing patch based on the absorbing the portion of the incident light; generating an electron-hole pair within a photodiode, the photodiode adjacent to the at least one light absorbing patch; the electron-hole pair forming a current within the photodiode responsive to the electron-hole pair; and detecting the current within the photodiode.

According to an embodiment, a method including absorbing, by a first light absorbing patch of a plurality of light absorbing patches, a portion of an incident light, the portion being a polarization component that is parallel to the first light absorbing patch, the light absorbing patched being aligned with a corresponding photodiode; generating, within the corresponding photodiode of the first light absorbing patch, a current; receiving, by each of the corresponding photodiodes, the incident light; generating, within each of the photodiodes, a photoelectric current from received incident light; measuring, by a photodetector, the current and the photoelectric current within each of the corresponding photodiodes; comparing, the measured current and photoelectric currents within each of the photodiodes, to determine, whether the measured currents satisfy a threshold; and determining, from the comparison, an angle of polarization of the incident light based on an angle of orientation of the first light absorbing patch.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed of one or more semiconductors such as silicon, silicon-germanium, germanium, gallium arsenide, indium gallium arsenide, semiconductors on insulators such as silicon on sapphire, and other semiconductor materials known to those of skill in the art. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (such as Si vs. silicon); however, both have identical meanings.

The demand for image sensors particularly in mobile imaging, surveillance, monitoring, and biometric sensing has been increasing as of late. Accordingly, interest in complementary metal-oxide-semiconductor (CMOS) image sensors has grown, especially for infrared (IR) sensing used in biometric applications. However, sensitivity for IR and particularly far IR in conventional infrared CMOS image sensors has been limited by the silicon bandgap. In particular, the detection of IR radiation requires a larger absorption volume than with shorter wavelengths, which runs contrary to demands for increased pixel density and therefore reduced absorption volume.

Current polarization-sensitive CMOS IR image sensors are limited to silicon inner-photoelectric-effect bandgap wavelengths sensors, where absorption of photons directly elevates an electron into the conduction band; these sensors fail if incoming photons are not more energetic than the energy required to elevate an electron, an energy determined by the bandgap of the material. There is a long-felt need to expand image sensors to include image sensors that detect further into the infrared. Past approaches to sensing further into the infrared include microbolometer sensors that focus infrared light on temperature sensors, and inner-photoelectric-effect sensors using lower-bandgap semiconductor materials.

Advantageously, embodiments disclosed herein extend IR sensing and polarization sensing simultaneously using a thermal-absorption, phonon-mediated, effect. IR photons are absorbed causing IR local heating effect of thin conductor or/and narrow band gap semiconductor layers set at a top interface of a Si photodiode depletion region; this heating produces phonons that in turn generate electron-hole pairs. Infrared photon(s) absorbed in the thin layer generates photon-correlated electron-hole pairs within a photodiode due to local increase in phonon density. Within 10 picoseconds of electron-hole pair generations, the generated electrons and holes from the electron-hole pairs separate and are stored by a photodiode depletion field. Light absorbing patches aligned along a direction of the electric field polarization of incident light generates the largest signal and therefore allows assignment of polarization state of incident light to one of four possible linear polarization states (such as 00, 45°, −45° and 90°) by comparing relative signals of photodiodes located under the same microlens in a quad phase detection (QPD) pixel (which is a single microlens covering four photodiodes) and having four light absorbing patches, each aligned with a corresponding photodiode.

Figure 1:
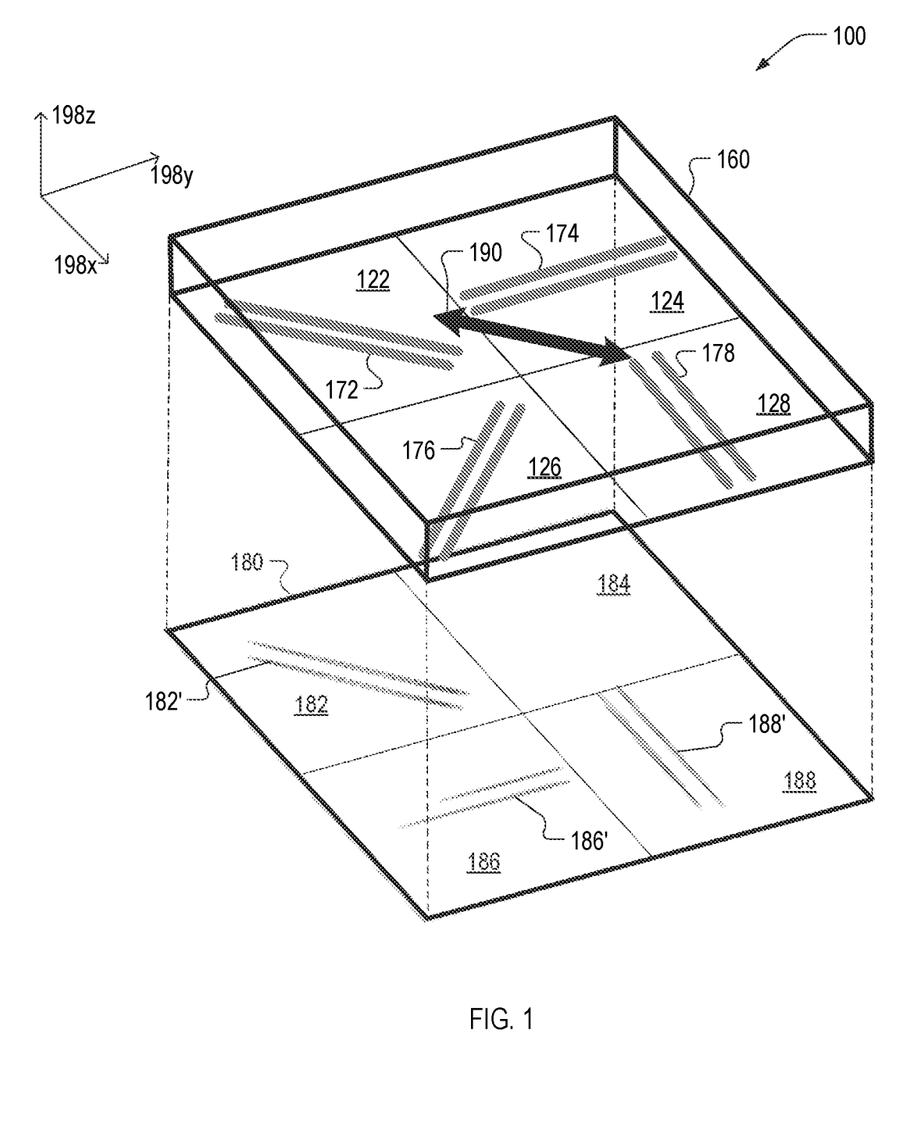
FIG. 1 is a schematic of a quad phase detection pixel, according to an embodiment.

FIG. 1 denotes axes $198x$, $198y$, and $198z$, where the $198z$-axis is orthogonal to a plane formed by orthogonal axes $198x$ and $198y$. Herein, the $198x$-$198y$ plane is formed by orthogonal axes $198x$ and $198y$ and is referred to as a horizontal plane. Also, herein, a width refers to an object's extent along the $198x$ axis, a depth refers to an object's extent along the $198y$ axis, a thickness (or thinness) refers to an object's extent along the $198z$-axis, and vertical refers to a direction along the $198z$-axis. Unless otherwise specified, heights of objects herein refer to the object's extent along axis $198z$. Also, herein, "above" refers to a relative position a distance away along the $198z$-axis in the positive direction and "below" refers to a relative position a distance away along the $198z$-axis in the negative direction.

Figure 2A:
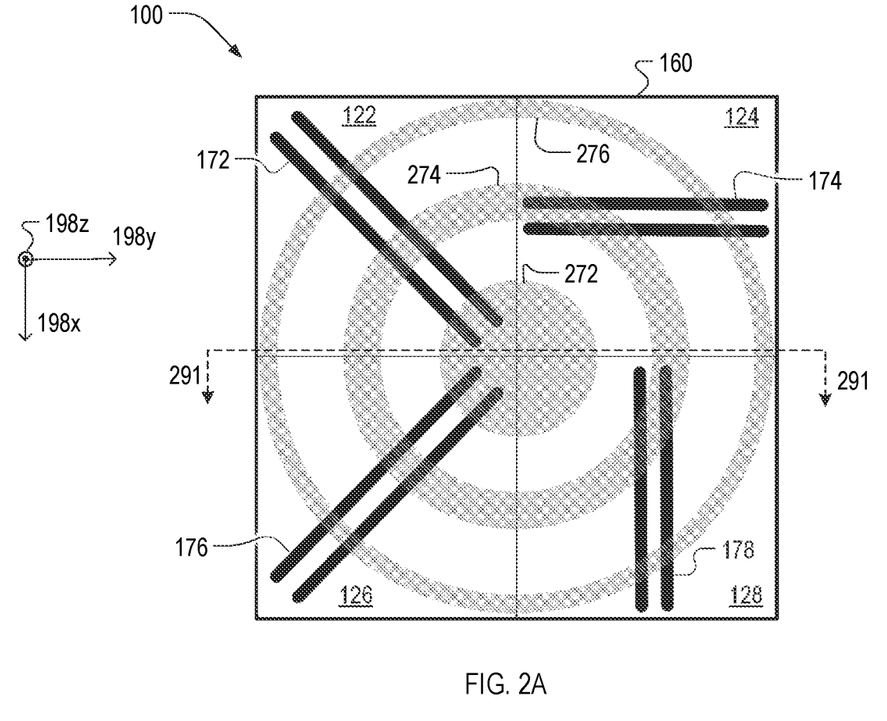
FIGS. 2A and 2B illustrate a top view and a side view of a quad phase detection pixel, according to embodiments.
Figure 2B:
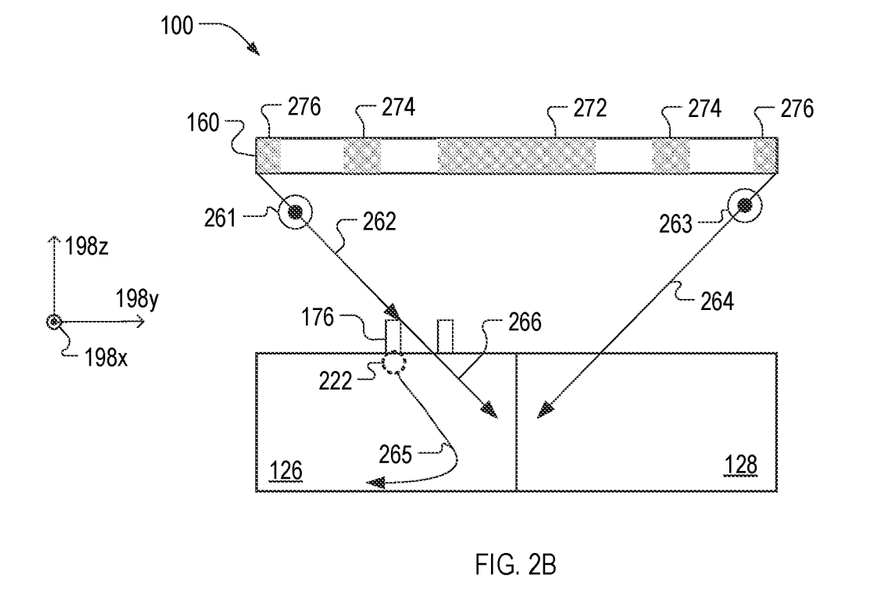

FIGS. 1, 2A, 2B are best viewed together in the following description. FIG. 1 is a schematic of an example quad phase detection (QPD) pixel 100. QPD pixel 100 includes a microlens 160 and four sets of light absorbing patches 172, 174, 176, and 178, each set of light absorbing patches 172, 174, 176, and 178 is aligned above a corresponding photodiode 122, 124, 126, and 128. In embodiments, each set of light absorbing patches 172, 174, 176, and 178 may include any number of patches per corresponding photodiode, such as one, two, three, and so on. The sets of light absorbing patches 172, 174, 176, and 178 may be aligned in predetermined angles, such as 0°, 45°, −45°, and 90° from a reference angle. For example, in FIG. 1, light absorbing patch 174 is parallel to axis $198y$, light absorbing patch 172 is rotated 45° clockwise from axis $198y$, light absorbing patch 178 is parallel to axis $198x$, and light absorbing patch 176 is rotated 45° clockwise from axis $198x$. Light absorbing patches may be thin strips of light sensitive material, where each thin strip is aligned in such a way that an incident light with a certain polarization parallel to the alignment of the thin strip may be partially absorbed. For example, an incident light with a polarization direction 190, which is in parallel direction to the alignment of light absorbing patches 172, is partially absorbed by light absorbing patch 172. In the same example, alignments of other light absorbing patches may also have directional components that are parallel to polarization direction 190 of the incident light. In such an example, each of the remaining light absorbing patches 174, 176, and 178 also absorbs an amount of the incident light that is proportional to the magnitude of its directional component being parallel to the polarization of the incident light. Light absorbing patches may comprise a material that are sensitive to electromagnetic radiation within a specific wavelength spectrum, such as the infrared spectrum (such as 1500 nm) for biometric data (which includes temperature, and so on). For example, light absorbing patches 172, 174, 176, and 178 may comprise Tungsten, Tungsten silicide, or any material as required to detect a desired wavelength spectrum. In embodiments, light absorbing patches may be approximately 10×100×500 nanometers and may be oriented in any spatial orientation.

The absorption of light by light absorbing patches 172, 174, 176, and 178 can generate local heating in the vicinity of the patches including near the top interface of the photodiode depletion region such as photodiode region with local heating 222. The generated heat results in creation of electron-hole pairs in the photodiode depletion region in similar fashion to a generation of dark current and can be detected. The amount of electrons detected in this fashion is proportional to the amount of absorbed light in the light absorbing patches. For example, the amount of light absorbed by light absorbing patches 172, 174, 176, and 178 in response to incident light with polarization direction 190 is shown on a simulated heat map 180. Each of heat quadrants 182, 184, 186, and 188 on heat map 180 illustrates the amount of heat absorbed in a respective patch-alignment quadrant 182, 184, 186, and 188. As polarization direction 190 of the incident light is parallel to the alignment direction of light absorbing patches 172, heat map 180 indicates the highest amount of heating in heat quadrant 182, and a photodiode 122 corresponding to heat quadrant 182 receives the highest amount of heat-generated electrons. As shown in FIG. 1, heat quadrants 182, 186, and 188 have heat signatures 182', 186', and 188' illustrating a simulated heat detection from each of the corresponding sets of light absorbing patches 172, 176, and 178 absorbing polarized light. Heat map 180 and heat signatures 182'-188' are discussed in more detail with reference to FIGS. 3-6.

FIG. 2A is a schematic of a QPD pixel 100. The top view illustrated in FIG. 2A is parallel to the $198x$-$y$ plane, which is orthogonal to 198z-axis. FIG. 2A denotes a section line 291, which indicates the location of the orthogonal cross-sectional side view illustrated in FIG. 2B, which is parallel to 198y-z plane. Quad phase detection pixel 100 includes the sets of light absorbing patches 172-178 (at respective angles such as 45°, 0°, −45°, and 90°, with reference to the 198y-axis) and corresponding photodiodes 122, 124, 126, and 128.

Quad phase detection pixel 100 further includes diffractive lenses in the form of a disk 272 and two concentric rings 274 and 276 within microlens 160 (which may be in a conventional convex shape). In FIG. 2B, diffractive lenses 272-276 may comprise any material, such as silicon nitride, and so on. Diffractive lenses 272-276 redirect incident light 261, 263 on a trajectory 262, 264 towards photodiodes (such as photodiodes 126, 128). For example, diffractive lens 276 redirects incident light 261 on trajectory 262 towards photodiode 126. A component of light 261 (such as an polarized electrical field) interacts with light absorbing patch 176, thereby generating local heating 222, that generates an electron-hole pair (from an increase in the phonon density of photodiode 126). An electrical current is generated from the electron-hole pair, and travels through photodiode 126 along path 265. Trajectory of the electrical current may be according to a reference current (not shown) within photodiode 126. Photodetectors (not shown) collect the electrical current, which is measured and the magnitude of the current is denoted herein as a heat signature (such as heat signatures 182'-188'). In embodiments, generated current is collected by a depletion field within the photodiode 126 and may have any voltage (such as 1.8 volts, 2 volts, and the like).

In addition to the electrical current, light on trajectory 262 and the remaining portion of light 261, denoted as light 266, may continue through to photodiodes 126, 128, causing a photoelectric current within photodiodes. Photodetectors collect the photoelectric current, along with the electrical current. To determine which set of light absorbing patches absorbed component of light 261, comparator (for example, current comparator 908, discussed with reference to FIG. 9) may compare measured currents (including electrical and photoelectric currents) from each photodiode to determine whether current measured within one photodiode satisfies a threshold. The angle of polarization of the incident light may be determined based on a current within a photodiode satisfying the threshold based on the angle of the corresponding light absorbing patch 176. Each of the aforementioned steps are discussed in detail below, with reference to at least FIGS. 7-9.

FIGS. 3-6 are best discussed together with the following description. FIGS. 3-6 illustrate simulated heat maps, each corresponding to one of four different polarization angles of components of incident light (such as a polarization angle of an electrical field). Each heat map 300-600 shows the local heating (such as local heating 222) cross section images for absorption of 1500 nm IR light and corresponding measured electric current generated from the light absorbing patch-component of light interaction, as discussed above. The polarization angles 390, 490, 590, 690 correspond to polarization angles for respective sets of light absorbing patches 172, 174, 176, and 178, with reference to FIGS. 1, 2A, and 2B, but are represented in the center of heat maps 300-600 for ease of illustration and to denote the corresponding heat signatures 182'-188' resulting from absorption of light at specific polarization angles.

Figure 3:
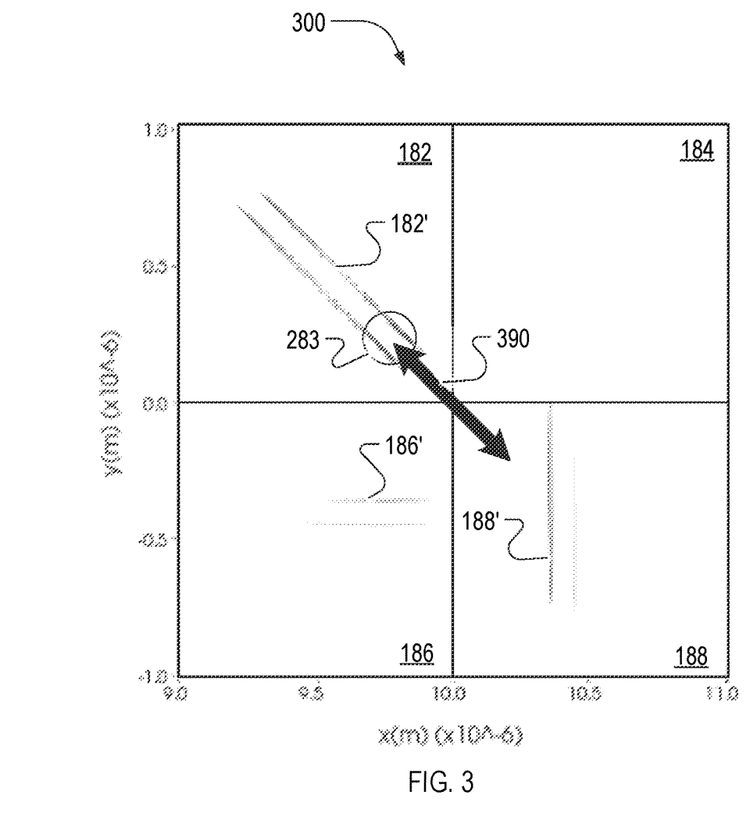
FIGS. 3-6 show simulated heat maps of light absorbing patches in response to incident polarized light, according to embodiments.
Figure 4:
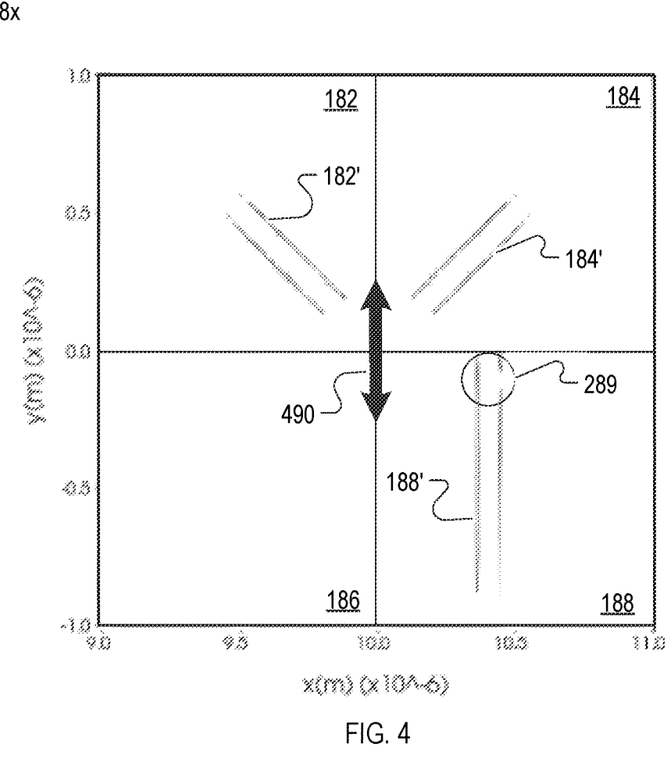
Figure 5:
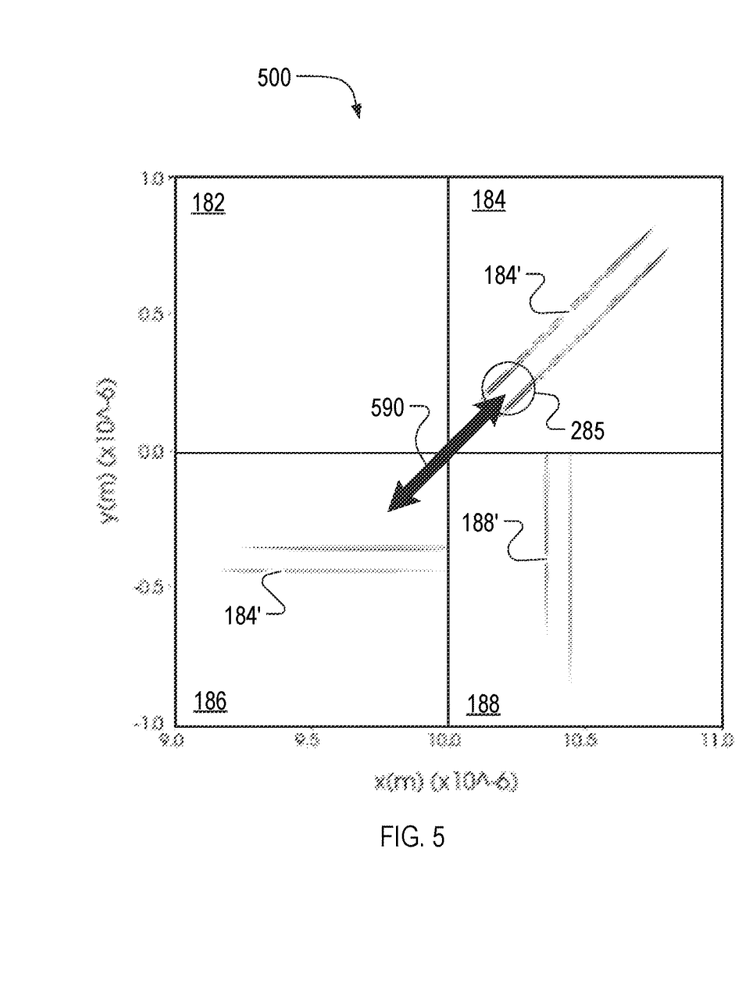
Figure 6:
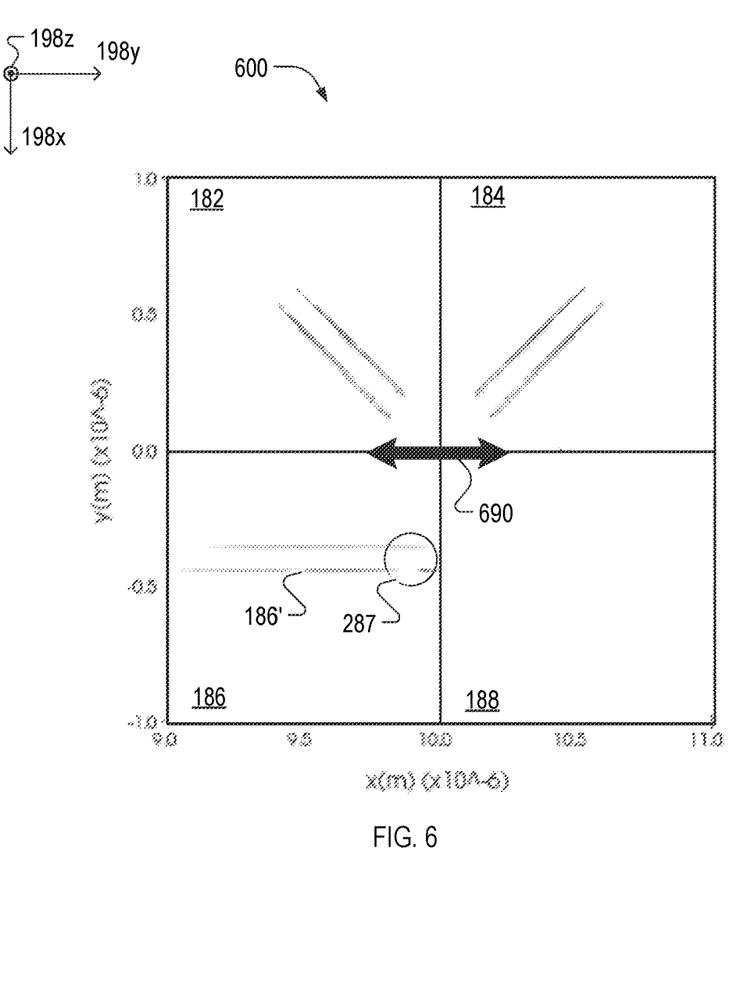

Heat map 300 of FIG. 3 shows a measured electrical current from corresponding polarization angle 390 (−45°, with respect to the 198y-axis) as indicated by heat signature 182' within quadrant 182. As shown within FIG. 3, heat signatures 186' and 188' have negligible magnitudes in comparison to heat signature 182'. Heat map 400 of FIG. 4 shows polarization angle 490 (0°, with respect to the 198x axis) as indicated by heat signature 188' within quadrant 188. As shown within FIG. 4, heat signatures 182' and 184' have negligible magnitudes in comparison to heat signature 188'. Heat map 500 of FIG. 5 shows polarization angle 590 (45°, with respect to the 198y axis) as indicated by heat signature 184' within quadrant 184. As shown within FIG. 5, heat signatures 184' and 188' have negligible magnitudes in comparison to heat signature 184'. Heat map 600 of FIG. 6 shows polarization angle 690 (0°, with respect to the 198y axis) as indicated by heat signature 186' within quadrant 186.

Figure 7:
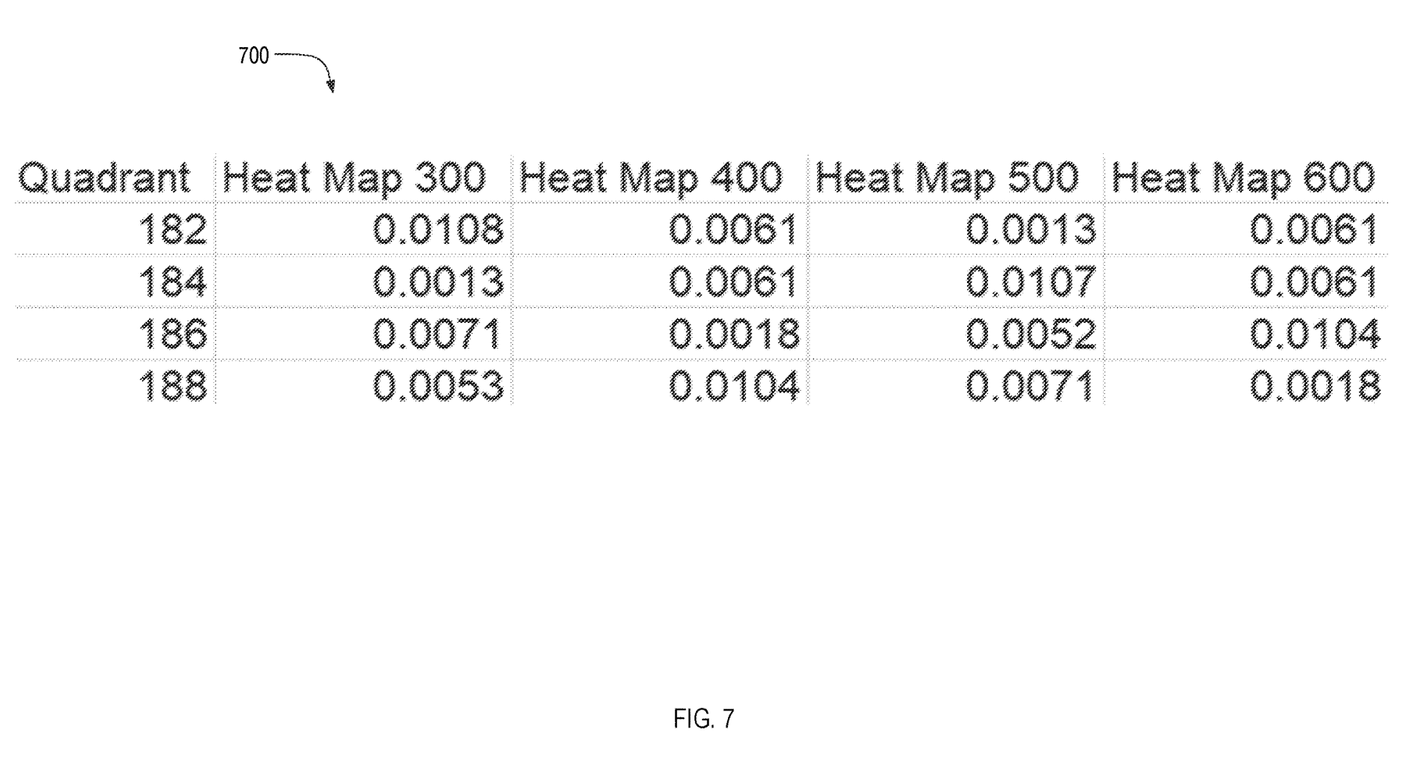
FIG. 7 is a table illustrating photodetector measurements in response to incident polarized light, according to an embodiment.

FIG. 7 shows a table 700 of heat map 300-600 readings from FIGS. 3-6 at corresponding quadrants. Table 700 lists numerical values indicating corresponding magnitudes for each heat signature within specific quadrants in the respective heat map. For example, as listed within table 700, quadrant 182 shows numerical values corresponding to heat signature 182', with respect to various heat maps 300-600. Quadrant 182 shows the highest numerical value in heat map 300, with lower numerical values in heat maps 400-600. Likewise, quadrants 184, 186, and 188 show highest numerical values corresponding to heat values at heat maps 500, 600, and 400, respectively. The numerical value is based on the angle of light absorbing patch (such as light absorbing patches 172-178) with respect to the polarization angle of incoming light. As indicated in table 700, and heat maps 300-600, light absorbing patches parallel to the polarization angle of incoming light exhibit the highest values, and those orthogonal to the polarization angles, exhibit the lowest values.

Figure 8:
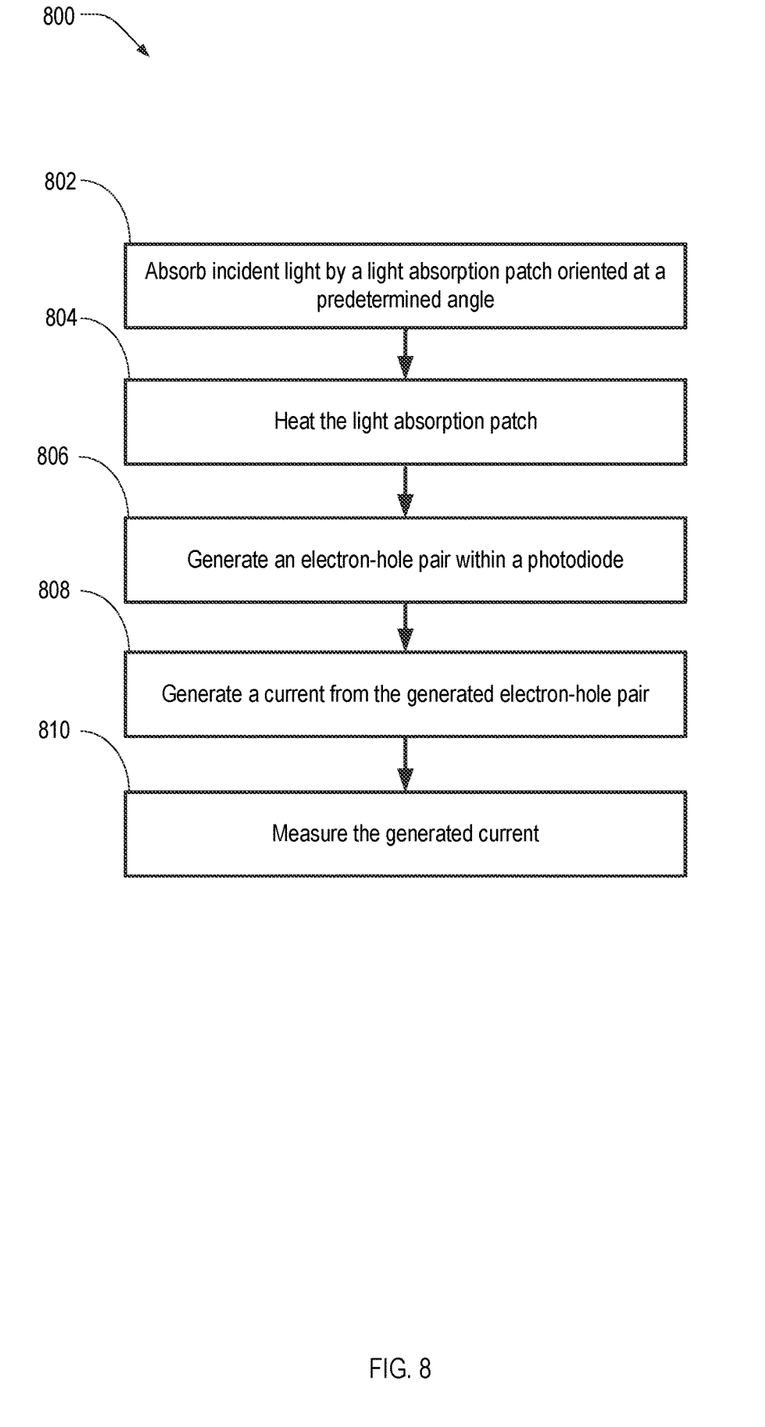
FIG. 8 is a flowchart illustrating a method for detecting incident light using at least one light absorbing patch, according to an embodiment.

FIG. 8 is a flowchart illustrating a method 800 for detecting incident light using at least one light absorbing patch. In step 802, a light absorbing patch absorbs a component of incident light. In one example of step 802, the light absorbing patch 176 is approximately parallel to the angle of polarization of light 261, as discussed with reference to FIGS. 3-6. In another example of step 802, light absorbing patch 176 comprises Tungsten, Tungsten silicide, or any material that can detect the desired wavelength spectrum of light 261. In yet another example of step 802, incident light 261 is infrared light and may be 1500 nm. In yet another example of step 802, incident light 261 is redirected toward photodiode 126 by diffractive lens disk 272 and concentric rings 274, 276. In yet another example of step 802, the component of the incident light is a polarization at an angle parallel to the light absorbing patch.

In step 804, light absorbing patch is heated from the light absorbing patch interacting with the component of incident light. In step 806, an electron-hole pair is generated within a photodiode 126 aligned with the light absorbing patch. In one example of step 806, the electron-hole pair is generated from local heating 222 of the light absorbing patch 176. In step 808, a current within the photodiode is generated from the electron-hole pair. In one example of step 808, the current travels through photodiode 126 along path 265 according to a reference voltage. In one example of 808, the reference voltage is adjusted to direct the path 265 of the current through the photodiode toward a photodetector. In step 810, the current is detected. In one example of step 810, the photodetector measures the current from location proximate to the photodiode. In one example of step 810, the angle of polarization of the component of incident light is determined based on the measured current.

In embodiments, there may be a plurality of light absorbing patches (such as with reference to light absorbing patches 172-178 of FIG. 1, 2A) aligned with corresponding photodetectors (such as photodetectors aligned with photodiodes 122-128 of FIGS. 1, 2A) and the incident light may enter through each of the photodetectors, generating a photoelectric current within each of the photodiodes. The photoelectric current within each of the corresponding photodiodes is measured by corresponding photodetectors, along with the measured current from step 810. The measured current and photoelectric currents from each corresponding photodiode may be compared to determine the angle of polarization of the component of incident light. For example, assuming the incident light enters each of the corresponding photodiodes approximately equally, the additional current from the component of incident light absorbed by the light absorbing patch may indicate that the angle of polarization of the component of incident light is parallel to the predetermined angle of the light absorbing patch.

Figure 9:
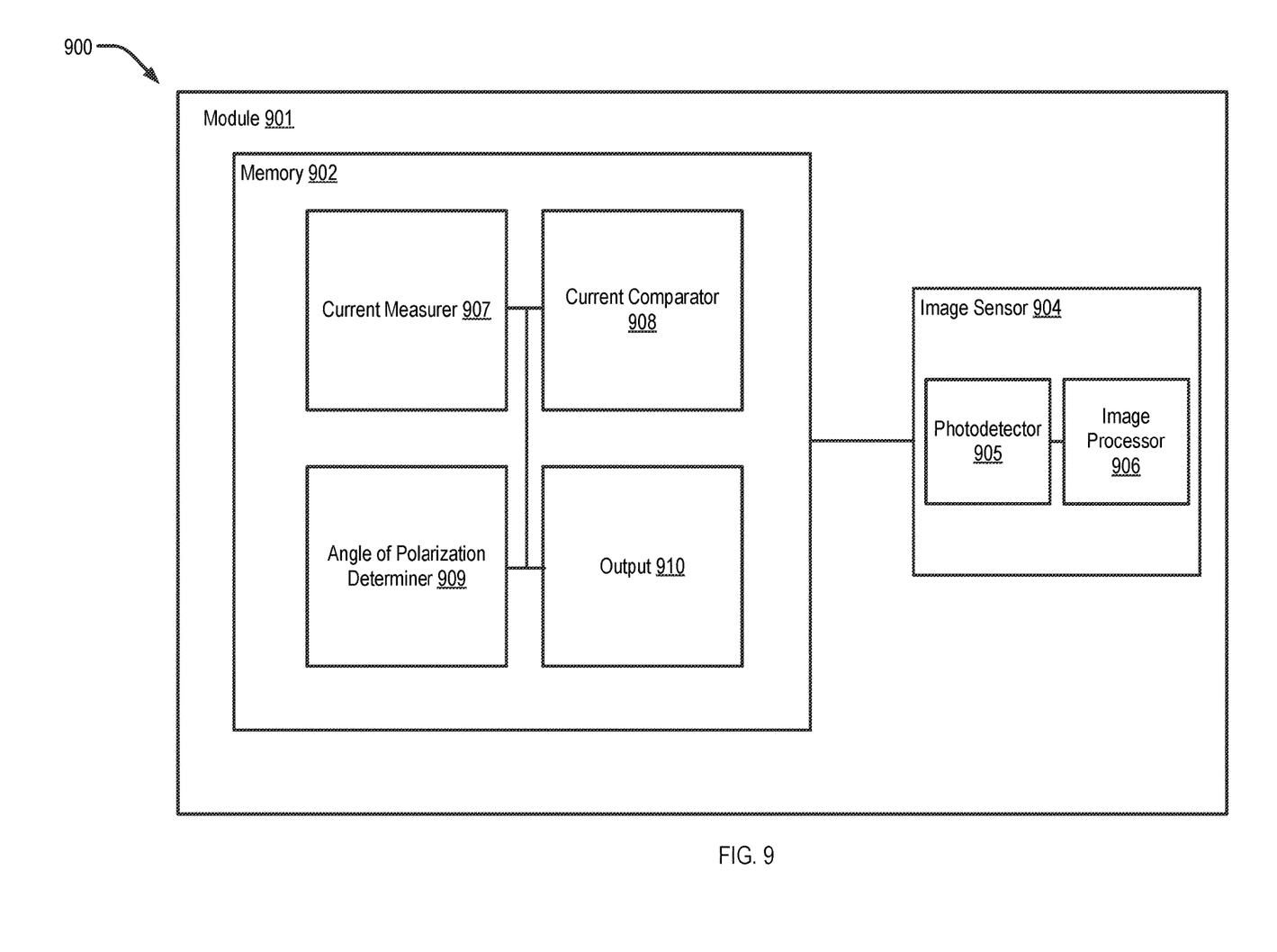
FIG. 9 is a block diagram of an example computing apparatus, according to an embodiment.

FIG. 9 is a block diagram of an example computing apparatus 900 for determining an angle of polarization of a component of incident light. Computing apparatus 900 includes module 901 with memory 902 and image sensor 904. Image sensor 904 includes at least one photodetector 905 and an image processor 906. Memory include machine readable instructions including current measurer 907, current comparator 908, angle of polarization determiner 909, and output 910. The machine readable instruction 907-910 of memory, when executed by image processor 906, cause the processor to measure current from the photodetector 905, the current collected from at least one photodiode (as discussed above with reference to FIGS. 1-8). Further the machine readable instructions cause the image processor 906 to compare measured currents from each photodiode. Further, the machine readable instructions (such as instructions implementing current comparator 908) may cause the processor to determine whether one of the measured currents satisfies a threshold or a threshold value greater than the other measured currents, indicating, as discussed with reference to FIG. 8, that a light absorbing patch has interacted with a component of incident light. The machine readable instructions (angle of polarization determiner 909) may further cause the processor to determine an angle of polarization of a component of incident light based on the photodiode corresponding to the measured current. The determined angle of polarization may be outputted by output 910 for display (such as within a graphical user interface).

Combinations of Features

Features described above as well as those claimed below may be combined in various ways without departing from the scope hereof. The following enumerated examples illustrate some possible, non-limiting combinations.

(A1) A polarization-sensitive infrared sensitive image sensor, including a plurality of pixels in a semiconductor substrate and forming a pixel array, each pixel including: at least one microlens; at least one photodiode; and at least one light absorbing patch above a corresponding photodiode, each light absorbing patch oriented at a predetermined angle with respect to each of the at least one light absorbing patch, the light absorbing patch absorbs a portion of incident light dependent on polarization of the incoming light relative to the predetermined angle of the light absorbing patch.

(A2) In the embodiment denoted by (A1), wherein the at least one photodiode forms a 2×2 array of photodiodes, the pixel array aligned under the microlens.

(A3) In the embodiments denoted by either (A1) or (A2), wherein each of the at least one light absorbing patch is aligned along a light polarization angle of either 0°, 45°, −45°, or 90°.

(A4) In the embodiments denoted by any of (A1)-(A3), wherein each of the at least one light absorbing patch comprises at least one light absorbing strip.

(A5) In the embodiments denoted by any of (A1)-(A4), wherein the plurality of light absorbing patch comprises Tungsten or Tungsten silicide.

(A6) In the embodiments denoted by any of (A1)-(A5), wherein each of the at least one microlens is positioned above a corresponding photodiode and light absorbing patch.

(B1) A method for detecting incident infrared light using at least one light absorbing patch, including absorbing a portion of an incident light by at least one light absorbing patch, the portion being a polarization component that is parallel to the at least one light absorbing patch; heating the at least one light absorbing patch based on the absorbing the portion of the incident light; generating an electron-hole pair within a photodiode, the photodiode adjacent to the at least one light absorbing patch; the electron-hole pair forming a current within the photodiode responsive to the electron-hole pair; and detecting the current within the photodiode.

(B2) In the embodiment denoted by (B1), further comprising redirecting, by a diffractive lens within a microlens, the incident light towards the photodiode.

(B3) In the embodiments denoted by either (B1) or (B2), wherein a shape of the diffractive lens is a disk or a ring.

(B4) In the embodiments denoted by any of (B1)-(B3), wherein the light absorbing patch comprises Tungsten or Tungsten silicide.

(B5) In the embodiments denoted by any of (B1)-(B4), wherein the incident light has an infrared wavelength.

(B6) In the embodiments denoted by any of (B1)-(B5), further comprising determining, based on a predetermined angle of each of the at least one light absorbing patch, an angle of a polarization component of the incident light.

(C7) A method, including absorbing, by a first light absorbing patch of a plurality of light absorbing patches, a portion of an incident light, the portion being a polarization component that is parallel to the first light absorbing patch, the light absorbing patched being aligned with a corresponding photodiode; generating, within the corresponding photodiode of the first light absorbing patch, a current; receiving, by each of the corresponding photodiodes, the incident light; generating, within each of the photodiodes, a photoelectric current from received incident light; measuring, by a photodetector, the current and the photoelectric current within each of the corresponding photodiodes; comparing, the measured current and photoelectric currents within each of the photodiodes, to determine, whether the measured currents satisfy a threshold; and determining, from the comparison, an angle of polarization of the incident light based on an angle of orientation of the first light absorbing patch.

(C2) In the embodiment denoted by (C1), further comprising: generating, within each of the photodiodes, a photoelectric current from the received incident light.

(C3) In the embodiments denoted by either (C1) or (C2), wherein each of the light absorbing patches comprises Tungsten or Tungsten silicide.

(C4) In the embodiments denoted by any of (C1)-(C3), further comprising redirecting, by a diffractive lens within a microlens, the incident light towards the photodiodes.

(C5) In the embodiments denoted by any of (C1)-(C4), wherein a shape of the diffractive lens is a shape of a disk or a ring.

(C6) In the embodiments denoted by any of (C1)-(C5), wherein the incident light has an infrared wavelength.

(C7) In the embodiments denoted by any of (C1)-(C6), wherein the photodiodes are organized as a tiling pattern comprising a 2×2 array of photodiodes.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. An infrared sensitive image sensor, comprising:
   a plurality of pixels in a semiconductor substrate and forming a pixel array, each pixel comprising:
   a 2×2 array of photodiodes; and
   a plurality of light absorbing patches each aligned above a respective one of the photodiodes and being oriented, with respect to each other of the plurality of light absorbing patches, at a light polarization angle of either 0°, 45°, −45°, or 90°.

2. The infrared sensitive image sensor of claim 1, wherein each of the plurality of light absorbing patches comprises at least one light absorbing strip.

3. The infrared sensitive image sensor of claim 1, wherein each of the plurality of light absorbing patches comprises tungsten or tungsten silicide.

4. The infrared sensitive image sensor of claim 1, further comprising a microlens above the 2×2 array of photodiodes and the plurality of light absorbing patches.

* * * * *